(12) United States Patent
Takano

(10) Patent No.: US 9,093,310 B2
(45) Date of Patent: Jul. 28, 2015

(54) SEMICONDUCTOR DEVICE HAVING A VARIATION LATERAL DOPING STRUCTURE AND METHOD FOR MANUFATURING THE SAME

(75) Inventor: Kazutoyo Takano, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/618,935

(22) Filed: Sep. 14, 2012

(65) Prior Publication Data

US 2013/0187240 A1 Jul. 25, 2013

(30) Foreign Application Priority Data

Jan. 24, 2012 (JP) ................ 2012-011869

(51) Int. Cl.
*H01L 29/66* (2006.01)
*H01L 29/10* (2006.01)
(Continued)

(52) U.S. Cl.
CPC ........ *H01L 29/1095* (2013.01); *H01L 21/2253* (2013.01); *H01L 21/266* (2013.01); *H01L 29/0615* (2013.01); *H01L 29/0619* (2013.01); *H01L 29/66333* (2013.01); *H01L 29/66712* (2013.01); *H01L 29/7395* (2013.01); *H01L 29/7802* (2013.01); *H01L 29/7811* (2013.01); *H01L 29/06* (2013.01); *H01L 29/0638* (2013.01); *H01L 29/0696* (2013.01); *H01L 29/36* (2013.01); *H01L 29/42372* (2013.01)

(58) Field of Classification Search
CPC ............................. H01L 29/36; H01L 29/06
USPC ........................................................ 257/409
See application file for complete search history.

(56) References Cited

U.S. PATENT DOCUMENTS 7,622,771 B2    11/2009  Ono et al.
2002/0100935 A1  8/2002  Inoue
(Continued)

FOREIGN PATENT DOCUMENTS

JP    2011-97116 A    5/2011
JP    2011-204710 A   10/2011

OTHER PUBLICATIONS

Knipper, U., Wachutka, G. ; Pfirsch, F. ; Raker, T. ; Niedermeyr, J. "Time-Periodic Avalanche Breakdown at the Edge Termination of Power Devices." in Proc. ISPSD, Orlando (USA), pp. 307-310, May 2008.*

(Continued)

*Primary Examiner* — Thao X Le
*Assistant Examiner* — Laura Dykes
(74) *Attorney, Agent, or Firm* — Studebaker & Brackett PC

(57) ABSTRACT

A semiconductor device including a semiconductor layer of a first conductivity type in a cell region, a first base layer of a second conductivity type on the semiconductor layer in the cell region; a second base layer of the second conductivity type on the semiconductor layer in an intermediate region; a conductive region of a first conductivity type in the first base layer; a gate electrode on a channel region placed between the conductive region and the semiconductor layer; a first electrode connected to the first and second base layers; a second electrode connected to the semiconductor layer; and a gate pad on the semiconductor layer via an insulating film in a pad region and connected to the gate electrode, an impurity concentration gradation in the gate pad side of the second base layer has a gentler VLD structure than an impurity concentration gradation in the first base layer.

5 Claims, 11 Drawing Sheets

(51) Int. Cl.
*H01L 29/739* (2006.01)
*H01L 21/266* (2006.01)
*H01L 29/78* (2006.01)
*H01L 21/225* (2006.01)
*H01L 29/06* (2006.01)
*H01L 29/36* (2006.01)
*H01L 29/423* (2006.01)

(56) References Cited

U.S. PATENT DOCUMENTS

2010/0044825 A1  2/2010  Schmidt
2011/0233714 A1  9/2011  Lu

OTHER PUBLICATIONS

An Office Action issued by the Korean Patent Office on Dec. 20, 2013, which corresponds to Korean Patent Application No. 10-2012-0148030 and is related to U.S. Appl. No. 13/618,935; with partial English translation.

R. Stengl et al.; "Variation of Lateral Doping as a Field Terminator for High-Voltage Power Devices"; IEEE Transactions on Electron Device; vol. ED-33, No. 3; pp. 426-428; Mar. 1986.

An Office Action issued by the Korean Patent Office on Jun. 10, 2014, which corresponds to Korean Patent Application No. 10-2012-0148030 and is related to U.S. Appl. No. 13/618,935; with partial English translation.

An Office Action; "Trial Decision," issued by the Korean Patent Office on Dec. 16, 2014, which corresponds to Korean Patent Application No. 10-2012-0148030 and is related to U.S. Appl. No. 13/618,935; with partial English translation.

An Office Action issued by the Korean Patent Office on Oct. 17, 2014, which corresponds to Korean Patent Application No. 10-2014-0119114 and is related to U.S. Appl. No. 13/618,935; with partial English translation.

The first Office Action issued by the Chinese Patent Office on Mar. 6, 2015, which corresponds to Chinese Patent Application No. 201310001570.8 and is related to U.S. Appl. No. 13/618,935; with partial English translation.

An Office Action issued by the Korean Patent Office on Apr. 22, 2015, which corresponds to Korean Patent Application No. 10-2014-0119114 and is related to U.S. Appl. No. 13/618,935; with partial English translation.

* cited by examiner

SEMICONDUCTOR DEVICE HAVING A VARIATION LATERAL DOPING STRUCTURE AND METHOD FOR MANUFACTURING THE SAME

BACKGROUND OF THE INVENTION

1. Field of the Invention

The present invention relates to a semiconductor device that can improve avalanche capacity without generating breakdown voltage lowering or ON resistance increasing, and a method for manufacturing the same.

2. Background Art

In order to realize the demands of markets, such as energy saving and device downsizing, the low loss of the transient state in the ON state and switching in semiconductor devices such as MOSFET and IGBT is demanded. Here, if only the ON state is observed, low loss can be enabled by making the wafer specification in the epitaxial layer which is a bulk portion have low resistance to lower the ON resistance. However, the ON resistance and the breakdown voltage are in the trade-off relation, and by simply making the wafer specification have a low resistance, the breakdown voltage of the element is lowered, and the object cannot be achieved. Therefore, by obtaining the effect of ON-resistance reduction by the low resistivity in the wafer specifications while optimizing the cell design in the low resistant wafer specification and obtaining high breakdown voltage, the improvement of tradeoff is enhanced.

When the avalanche operation due to the turn-off serge by inductive load switching occurs with the improvement of the breakdown voltage by the optimization of cell designing, the current easily flows into the portions other than the cells. In order to obtain a high withstand even under such conditions, there has been proposed what the P-type base layer under the gate pad is formed deeper than the P-type base layer of the edge terminating portion (the circumference of the chip); or what the P-type base layer under the gate pad is made floating (for example, refer to Japanese Patent Laid-Open No. 2011-97116).

SUMMARY OF THE INVENTION

If the voltage is elevated due to the back electromotive force of the inductive load, and exceeds the breakdown voltage of the element, the semiconductor device performs avalanche operation. The current value or the energy value at which the device can flow (or interrupt) at this time is called the avalanche capacity. If the avalanche current can easily flow to places other than the cell region due to the improvement of breakdown voltage of the cell region, there was a problem wherein the P-type base layers provided between the gate pad and the cell region are broken due to the concentration of currents in the avalanche operation.

In view of the above-described problems, an object of the present invention is to provide a semiconductor device that can improve avalanche capacity without generating breakdown voltage lowering or ON resistance increasing, and a method for manufacturing the same.

According to the present invention, a semiconductor device includes: a semiconductor layer of a first conductivity type in a cell region, a pad region, and an intermediate region placed between the cell region and the pad region of a semiconductor substrate; a first base layer of a second conductivity type on the semiconductor layer in the cell region; a second base layer of the second conductivity type on the semiconductor layer in the intermediate region; a conductive region of the first conductivity type in the first base layer; a gate electrode on a channel region placed between the conductive region and the semiconductor layer via a gate insulating film; a first electrode connected to the first and second base layers; a second electrode connected to a lower face of the semiconductor layer; and a gate pad on the semiconductor layer via an insulating film in the pad region and connected to the gate electrode, wherein an impurity concentration gradation in the gate pad side of the second base layer has a VLD (Variation Lateral Doping) structure which is gentler than an impurity concentration gradation in the first base layer.

The present invention makes it possible to improve avalanche capacity without generating breakdown voltage lowering or ON resistance increasing.

Other and further objects, features and advantages of the invention will appear more fully from the following description.

DETAILED DESCRIPTION OF THE PREFERRED EMBODIMENTS

A semiconductor device and a method for manufacturing the same according to the embodiments of the present invention will be described with reference to the drawings. The same components will be denoted by the same symbols, and the repeated description thereof may be omitted.

First Embodiment

Figure 1:
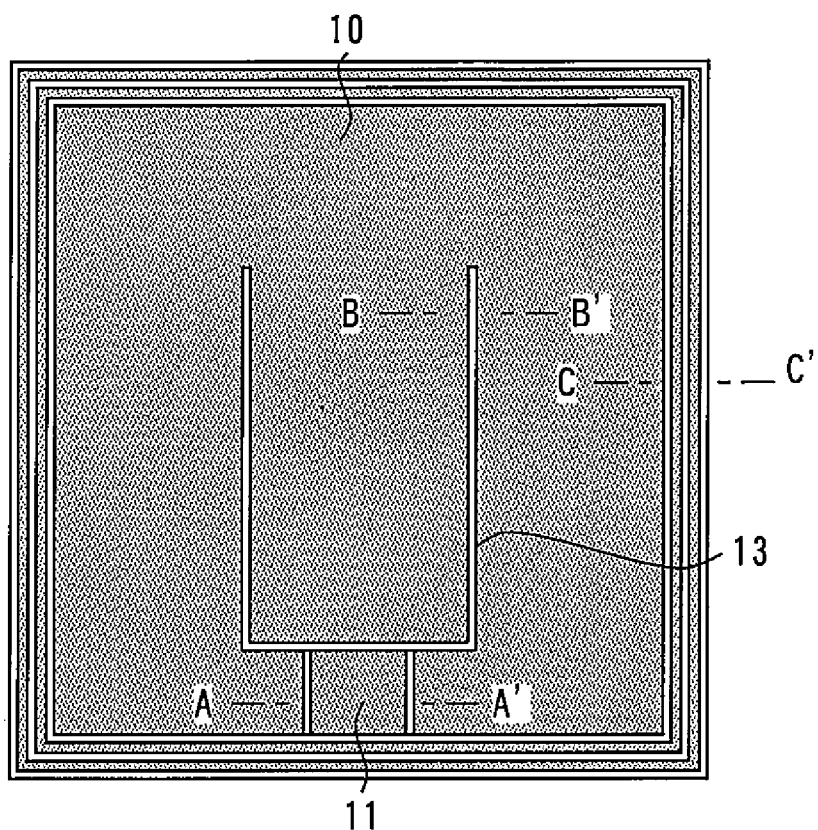
FIG. 1 is a top view showing a semiconductor device according to the first embodiment of the present invention.
Figure 2:
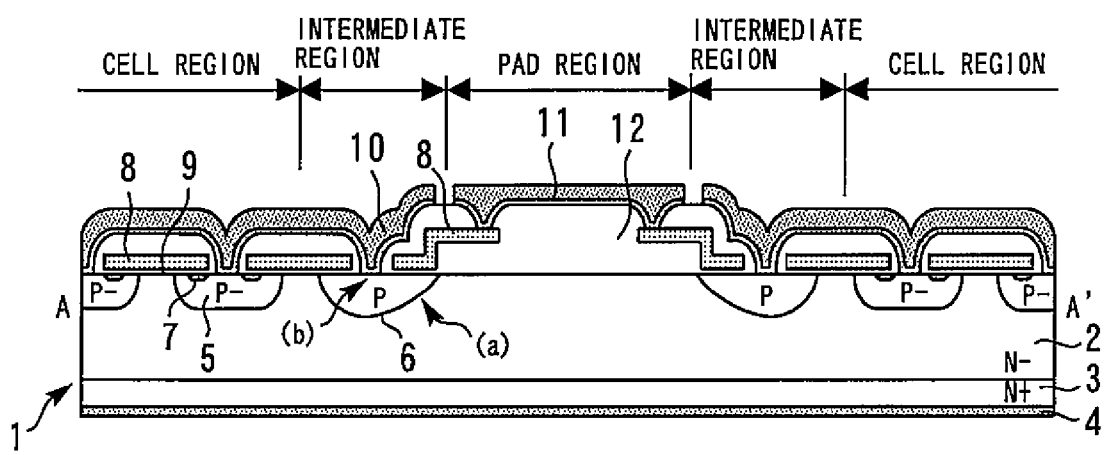
FIG. 2 is a sectional view taken along the line A-A' in FIG. 1.

FIG. 1 is a top view showing a semiconductor device according to the first embodiment of the present invention. FIG. 2 is a sectional view taken along the line A-A' in FIG. 1.

A silicon substrate 1 has a cell region, a pad region, an intermediate region, and an edge termination region. The intermediate region is placed between the cell region and the pad region. The edge termination region is placed outside the cell region and the pad region.

An $N^−$-type drain layer 2 is provided on the entire region in the silicon substrate 1. An $N^+$-type drain layer 3 is provided under the $N^−$-type drain layer 2, and a drain electrode 4 is connected on the lower face of the $N^+$-type drain layer 3.

In the cell region, a $P^−$-type base layer 5 is provided on the $N^−$-type drain layer 2. In the intermediate region, a P-type base layer 6 is provided on the $N^−$-type drain layer 2. In the $P^−$-type base layer 5, an $N^+$-type source region 7 is provided. A gate electrode 8 is provided on a channel region placed between the $N^+$-type source region 7 and the $N^−$-type drain layer 2 via a gate insulating film 9. A source electrode 10 is connected to the P-type base layer 5 and the P-type base layer 6. A drain electrode 4 is connected to the lower face of the $N^+$-type drain layer 3. In the pad region, a gate pad 11 is provided on the $N^−$-type drain layer 2 via an insulating film 12. The gate pad 11 is connected to the gate electrode 8.

The feature of the present embodiment is that the impurity concentration gradation in the gate pad 11 side (a) of the P-type base layer 6 circularly provided in the intermediate region around the gate pad 11 has a gentle VLD (Variation Lateral Doping) structure in comparison with $P^−$-type base layer 5.

Figure 3:
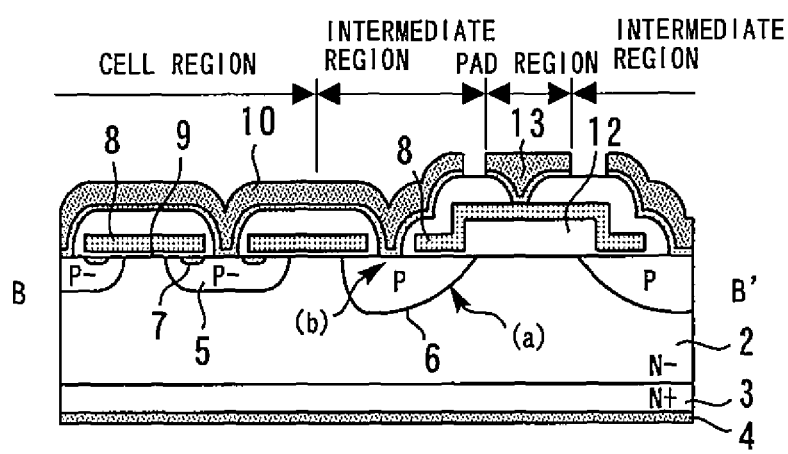
FIG. 3 is a sectional view taken along the line B-B' in FIG. 1.

FIG. 3 is a sectional view taken along the line B-B' in FIG. 1. The gate finger 13 is provided on the N-type drain layer 2 via the insulating film 12 in the pad region. (Although it is the finger region but not the pad region, here it is so called for convenience.) The gate finger 13 connects the gate electrode 8 with the gate pad 11. The impurity concentration gradation of the gate finger 13 side of the P-type base layer 6 has a more gentle VLD structure in comparison with the P-type base layer 5.

Figure 4:
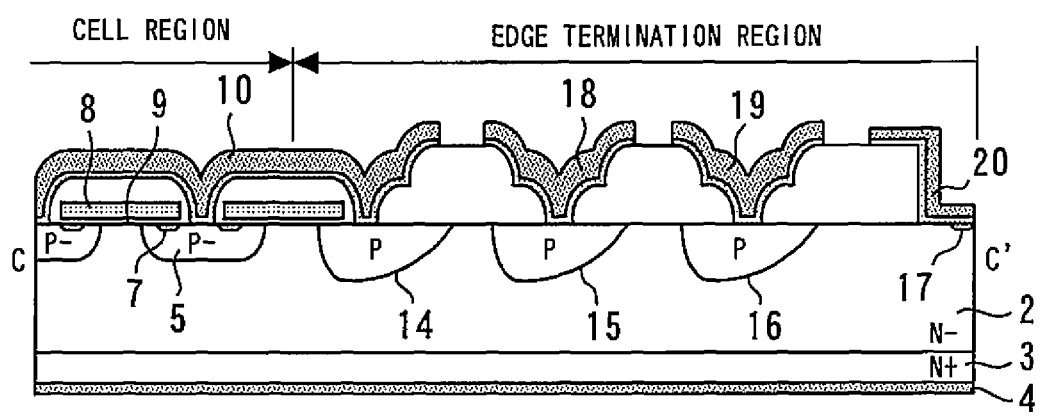
FIG. 4 is a sectional view taken along the line C-C' in FIG. 1.

FIG. 4 is a sectional view taken along the line C-C' in FIG. 1. In the edge termination region, P-type base layers 14, 15, and 16 are provided on the $N^−$-type drain layer 2. P-type base layers 14, 15, and 16 are FLRs (Field Limiting Rings). An $N^+$-type channel stopper layer 17 is provided on the outermost circumference. Ring electrodes 18 and 19 are connected to the P-type base layers 15 and 16, respectively. A channel stopper electrode 20 is connected to the $N^+$-type channel stopper layer 17. The impurity concentration gradations of outsides of the P-type base layers 14, 15, and 16 have more gentle VLD structures in comparison with the VLD structure of the P-type base layer 5.

Figure 5:
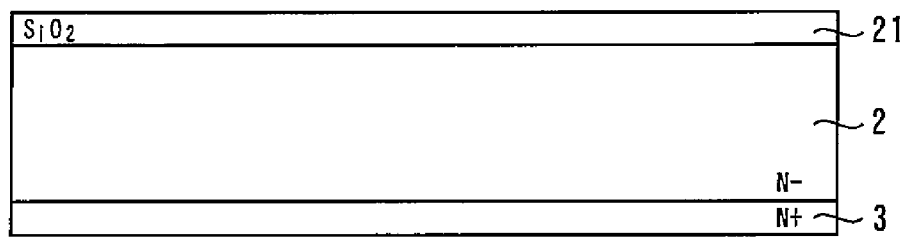
FIGS. 5 to 8 are sectional views showing the method for manufacturing the P-type base layer 6 in the intermediate region.
Figure 6:
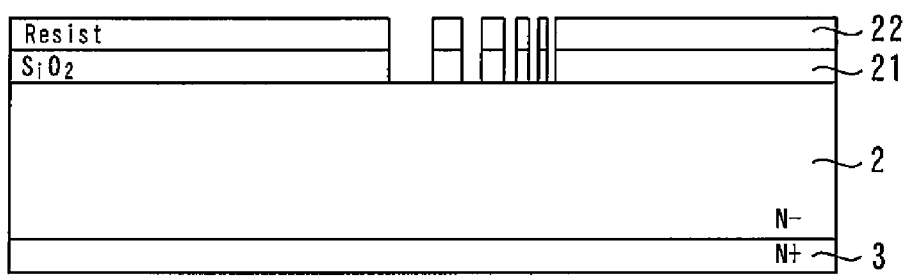

Next, a method for manufacturing the P-type base layer 6 in the intermediate region will be described. FIGS. 5 to 8 are sectional views showing the method for manufacturing the P-type base layer 6 in the intermediate region. At beginning, as shown in FIG. 5, an $SiO_2$ film 21 is formed on the $N^−$-type drain layer 2. Then, as shown in FIG. 6, a resist 22 is formed on the $SiO_2$ film 21, and the resist 22 is patterned by photoengraving. Etching is performed using the resist 22 as a mask to pattern the $SiO_2$ film 21.

Figure 7:
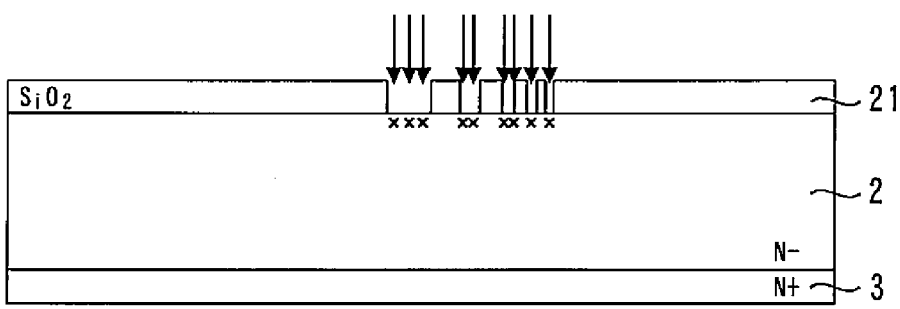
Figure 8:
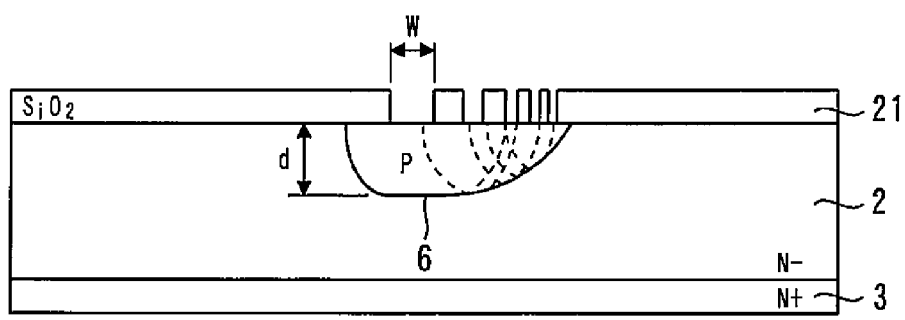

The $SiO_2$ film 21 after patterning has a plurality of openings narrowing towards the pad region in the intermediate region. Next, as shown in FIG. 7, impurities, such as boron, are injected into the $N^−$-type drain layer 2 through a plurality of openings in the $SiO_2$ film 21; and as shown in FIG. 8, the impurities are diffused by high-temperature driving to form the P-type base layer 6. The diffused structure having gentle impurity concentration gradation fabricated by such wafer process is called a VLD structure.

Furthermore, the outsides of the P-type base layers 14, 15, and 16 in the edge termination region are also formed by VLD (for example, refer to Semiconductor Devices and Power IC Handbook by Institute of Electrical Engineers of Japan, p. 62 to 63, and Japanese Patent Laid-Open No. 2011-204710).

Figure 9:
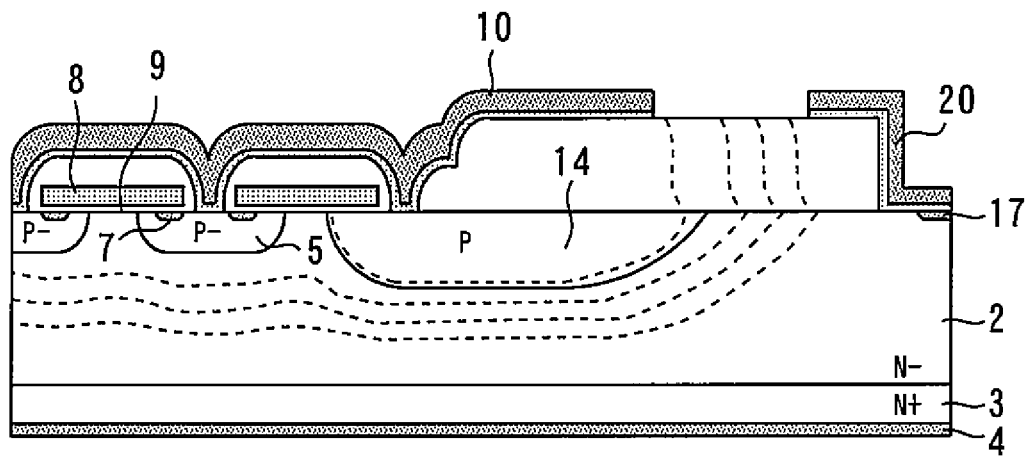
FIG. 9 is a sectional view showing the electric field distribution of the edge termination region.
Figure 10:
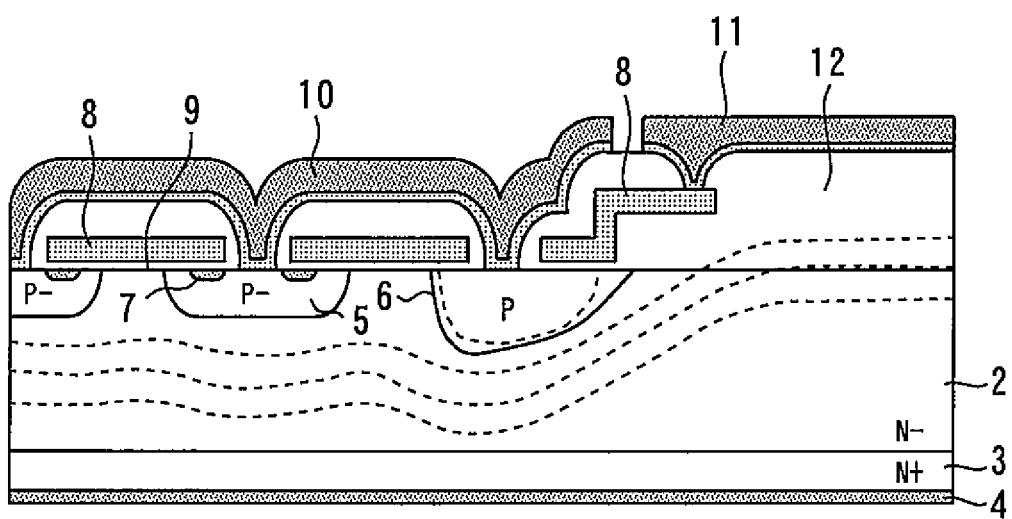
FIG. 10 is a sectional view showing the electric field distribution in the vicinity of the intermediate region (the gate pad region).

Next, the difference in the electric field distribution between the two regions where the P-type base layers of the VLD structure are provided will be described. FIG. 9 is a sectional view showing the electric field distribution of the edge termination region. FIG. 10 is a sectional view showing the electric field distribution in the vicinity of the intermediate region (the gate pad region). The dot lines show equipotential lines. In the edge termination region, there is potential difference between the source electrode 10 and the channel stopper electrode 20, and the device breakdown voltage is maintained in the horizontal direction. On the other hand, in the vicinity of the intermediate region (the gate pad region), there is no potential difference between the source electrode 10 and the gate pad 11.

Figure 11:
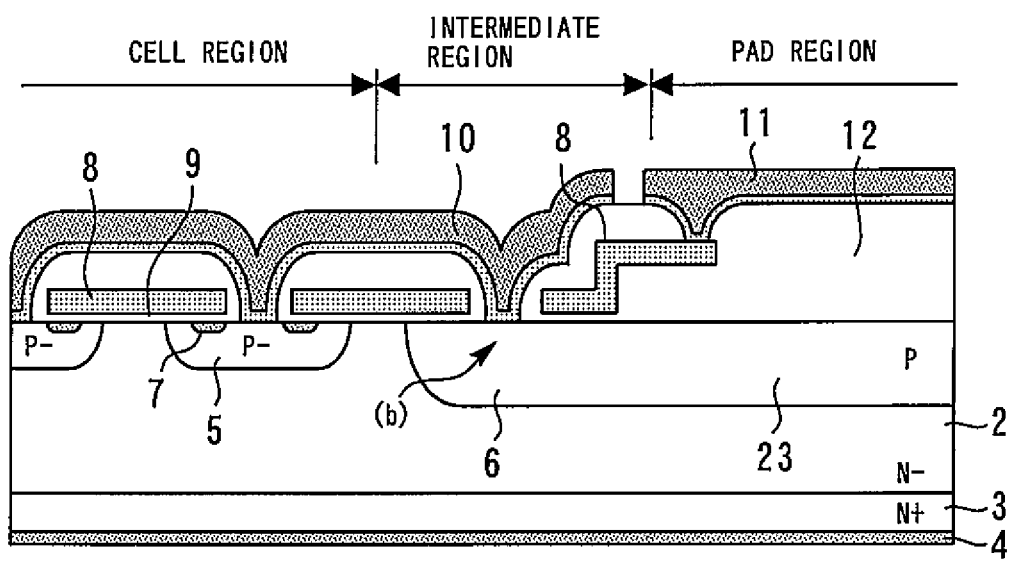
FIG. 11 is a sectional view showing a semiconductor device according to the first comparative example.

Next, the effect of the present embodiment will be described by comparing with that of the first and second comparative examples. FIG. 11 is a sectional view showing a semiconductor device according to the first comparative example. In the first comparative example, the P-type base layer 6 in the intermediate region is connected to the P-type base layer 23 in the pad region, and the thicknesses of the both are identical. In the case of the first comparative example, the avalanche current (impact-ionized current) due to impact ionization occurring immediately under the wide P-type base layers 6 and 23 flows into the source contact portion (b), and current concentration may occur and may result in breakdown.

Figure 12:
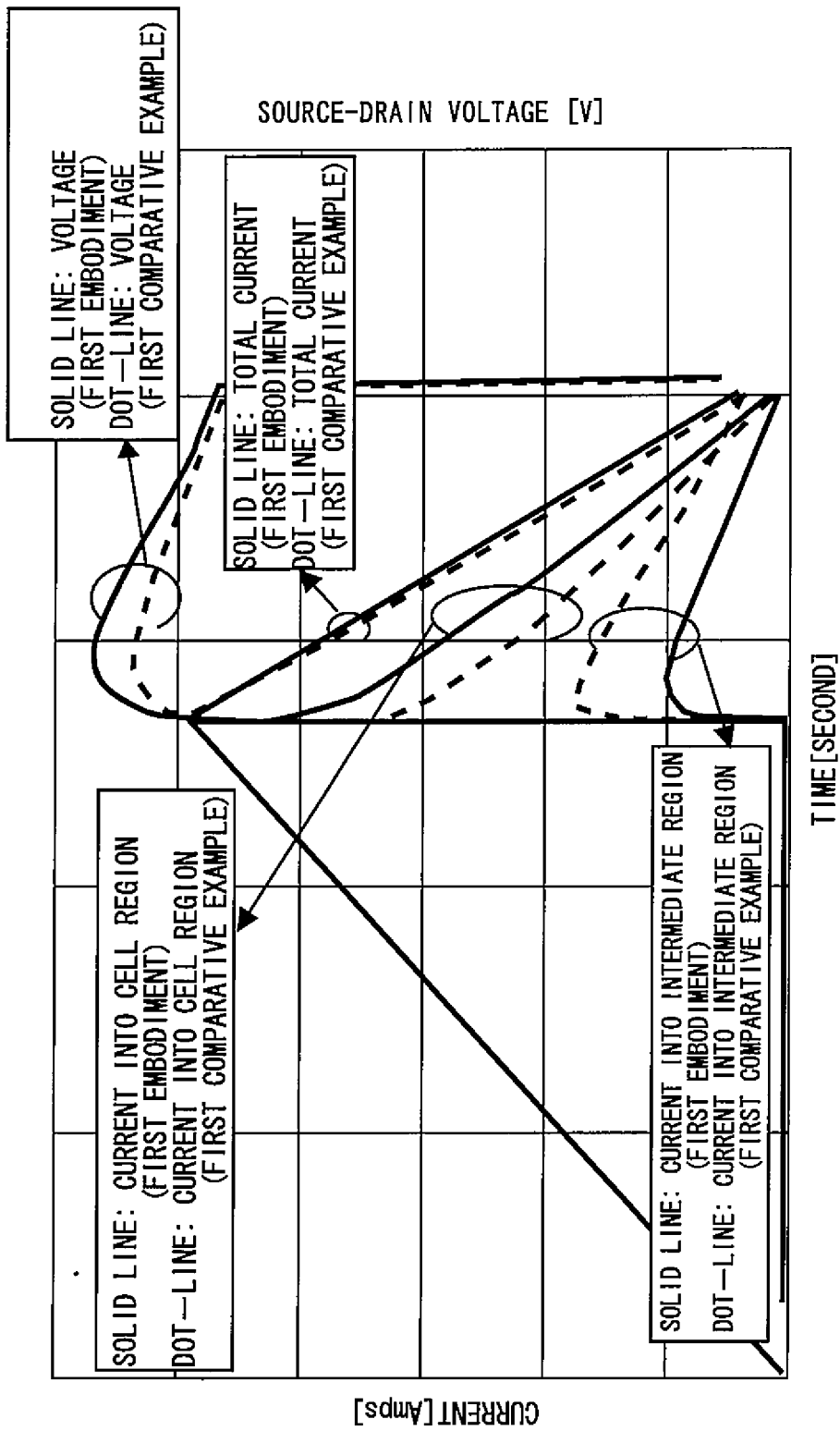
FIG. 12 is a graph showing the results of the simulation of switching wave form when the MOSFET is subjected to L-load switching.

FIG. 12 is a graph showing the results of the simulation of switching wave form when the MOSFET is subjected to L-load switching. The total current means the sum of currents in the cell region and the intermediate region. Although the total current of the first comparative example and the first embodiment are identical, since the current to the intermediate region is large in the first comparative example, the current concentration to the source contact portion occurs. On the other hand, in the first embodiment, since the current flowing into the cell region is increased, the current concentration to the intermediate region can be alleviated.

In addition, in the first comparative example, if the injected quantities of impurities or heat treatment are controlled to shallow the P-type base layers 6 and 23 in order to reduce the impact-ionized current, the P-type base layers 14, 15, and 16 formed simultaneously in the edge termination region are also shallowed. Therefore, the concentration gradations of the P-type base layers 14, 15, and 16 in the edge termination region are steepened (the curvature of the arc portions, that is, the radius, is reduced), edge termination breakdown voltage is lowered. Furthermore, the lowering of the avalanche capacity and the degradation of reliability are concerned.

Figure 13:
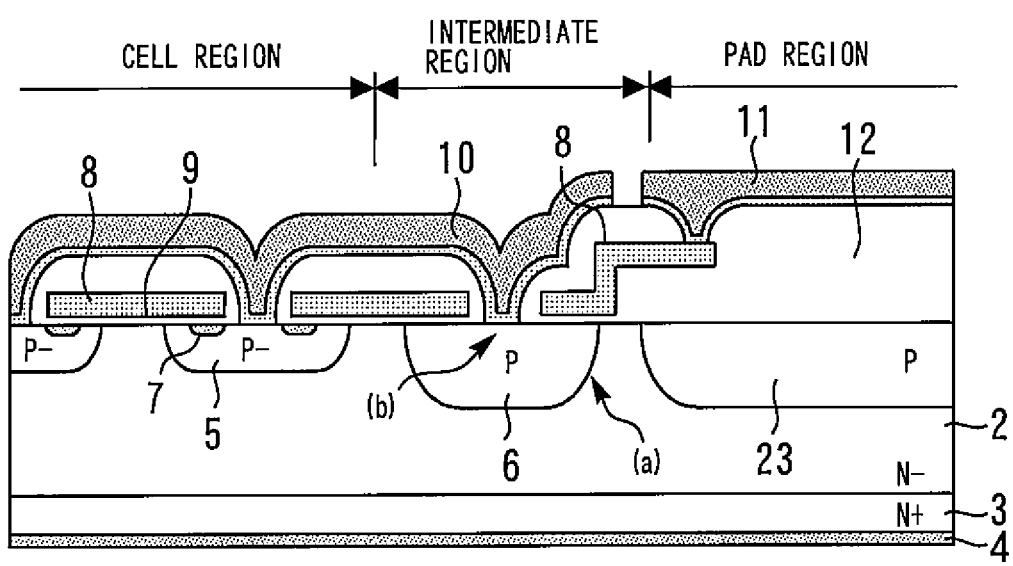
FIG. 13 is a sectional view showing a semiconductor device according to the second comparative example.
Figure 13:
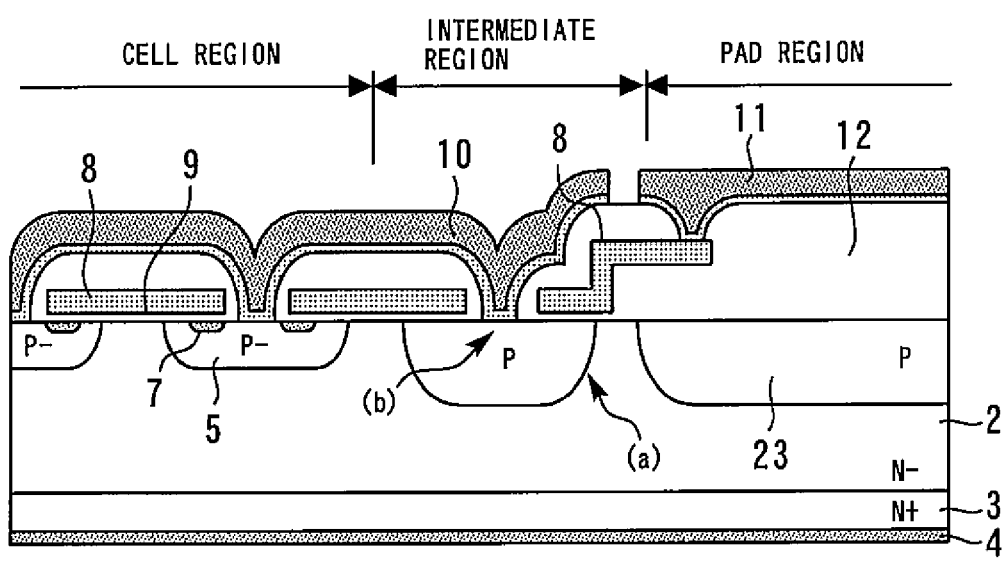

FIG. 13 is a sectional view showing a semiconductor device according to the second comparative example. In the second comparative example, the P-type base layer 6 in the intermediate region is separated from the P-type base layer 23. Specifically, the P-type base layer 23 in the pad region is floating. Thereby, the current concentration into the intermediate region can be alleviated. In the second comparative example, however, since the impurity concentration gradation in the gate pad 11 side (a) in the P-type base layer 6 is sharp (the curvature of the arc portion of the P-type base layer 6 is small), the impact-ionized current flows into the source contact portion (b), current concentration occurs, and the breakdown may occasionally be resulted.

Whereas in the present embodiment, the gate pad 11 side (a) of the P-type base layers 6 formed by VLD has the impurity concentration gradation of a gentle VLD structure in comparison to the P-type base layers 5. Thereby, the concentration of the impact-ionized current into the source contact portion (b) during the avalanche operation can be prevented. Therefore, the avalanche capacity can be improved.

Also in the present embodiment, the structure of the intermediate region is changed, and the structure of the cell region, which is the active region where the current flows, is not changed. Therefore, the breakdown voltage lowering or ON resistance elevation is not occurred.

In addition, the VLD structure is applied not only to the circumference of the gate pad 11, but also to the P-type base layers 6 around the gate finger 13. Thereby, impact ionization at the P-type base layers 6 around the gate finger 13 is prevented, and that the avalanche capacity becomes the design control of the gate finger 13 can be suppressed.

In addition, the maximum width w of a plurality of openings in the SiO$_2$ film 21 used in the formation of the P-type base layers 6 is preferably less than twice the depth d of the deepest part. Since the depth of the P-type base layers 6 becomes shallow when the width of the opening is narrow, the number of the N$^-$-type drain layers 2 can be increased, and the impact-ionized current can be reduced. On the other hand, when the P-type base layers 14, 15, and 16, which are FLRs, are formed, the largest width w of the opening is made to be twice or more of the depth d of the deepest portion of the P-type base layers 6, and the P-type base layers 14, 15, and 16 are deepened.

Furthermore, it is preferable to form the P-type base layers 6 in the intermediate region simultaneously with the P-type base layers 14, 15, and 16 in the edge termination region. Thereby, both the VLD structures can be formed without increasing the number of masks.

Figure 14:
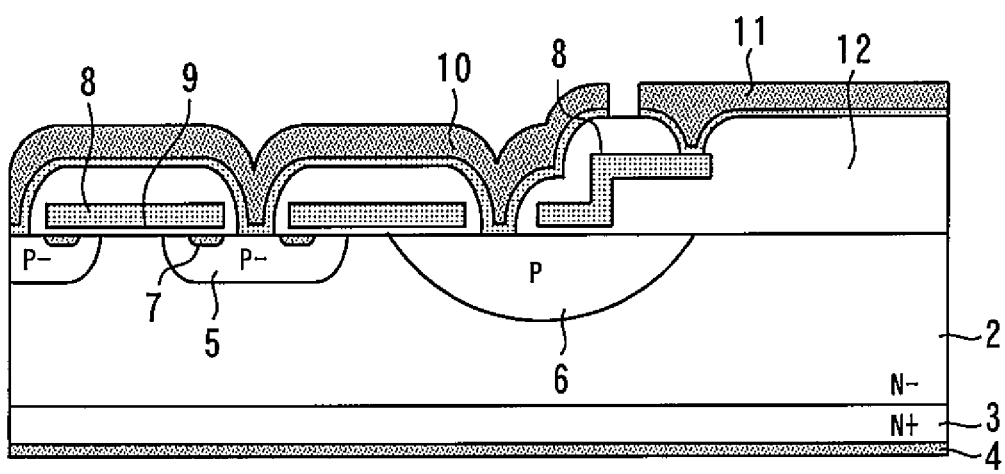
FIG. 14 is a sectional view showing the first modified example of the semiconductor device according to the first embodiment of the present invention.

FIG. 14 is a sectional view showing the first modified example of the semiconductor device according to the first embodiment of the present invention. At the side opposite to the gate pad 11 side in P-type base layers 6, the impurity content gradation has a more gentle VLD structure in comparison with the P-type base layer 5. Specifically, another VLD structure is formed on the cell side. Thereby, the concentration of the impact-ionized current to the source contact portion (b) can be surely prevented in the avalanche operation.

Figure 15:
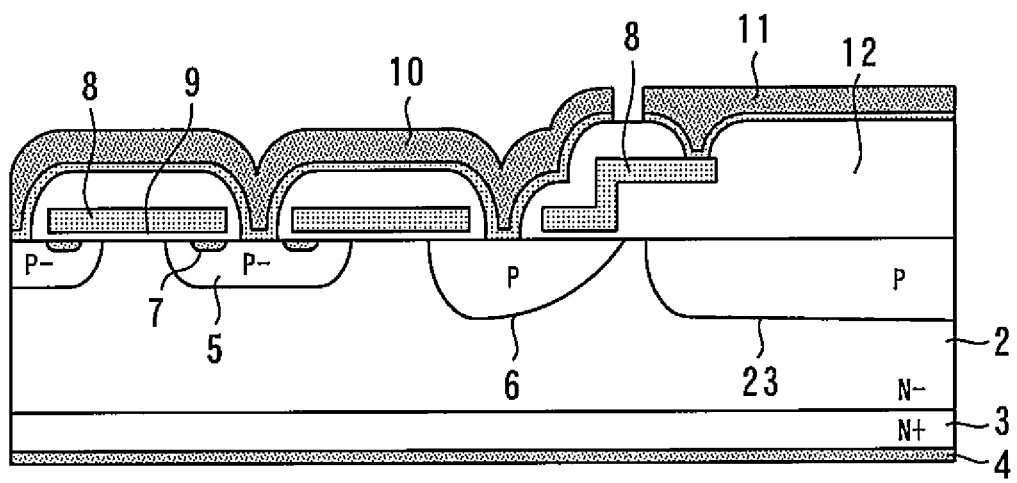
FIG. 15 is a sectional view showing a second modified example of a semiconductor device according to the first embodiment of the present invention.

FIG. 15 is a sectional view showing a second modified example of a semiconductor device according to the first embodiment of the present invention. In addition to the configuration of the first embodiment, a P-type base layer 23 is provided on the N$^-$-type drain layer 2 in the pad region. Thereby, the capacitance under the gate pad 11 can be reduced.

Second Embodiment

Figure 16:
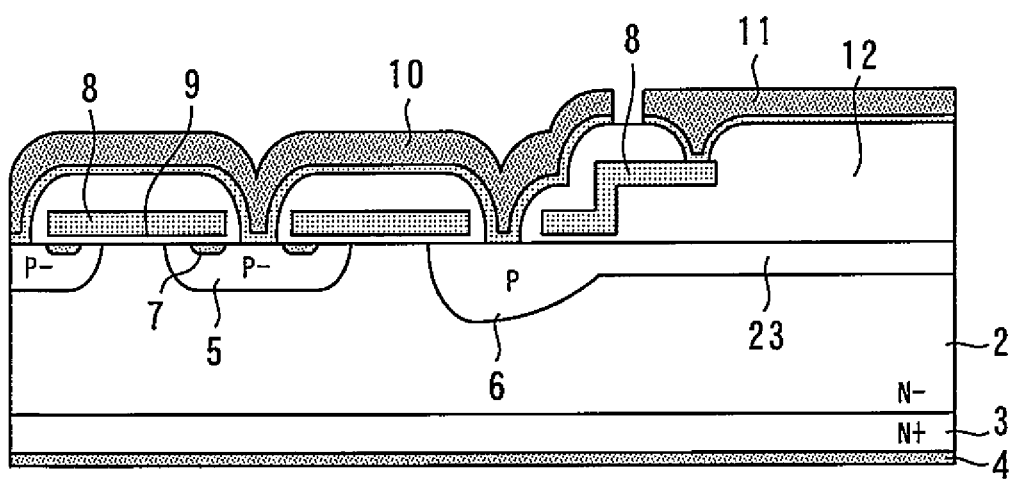
FIG. 16 is a sectional view showing a semiconductor device according to the second embodiment of the present invention.

FIG. 16 is a sectional view showing a semiconductor device according to the second embodiment of the present invention. In addition to the configuration of the first embodiment, a P-type base layer 23 is provided on the N$^-$-type drain layer 2 in the pad region. The P-type base layer 6 in the intermediate region is connected to the P-type base layer 23 in the pad region. However, different from the first comparative example, the P-type base layer 23 is shallower than the deepest portion of the P-type base layer 6.

Figure 17:
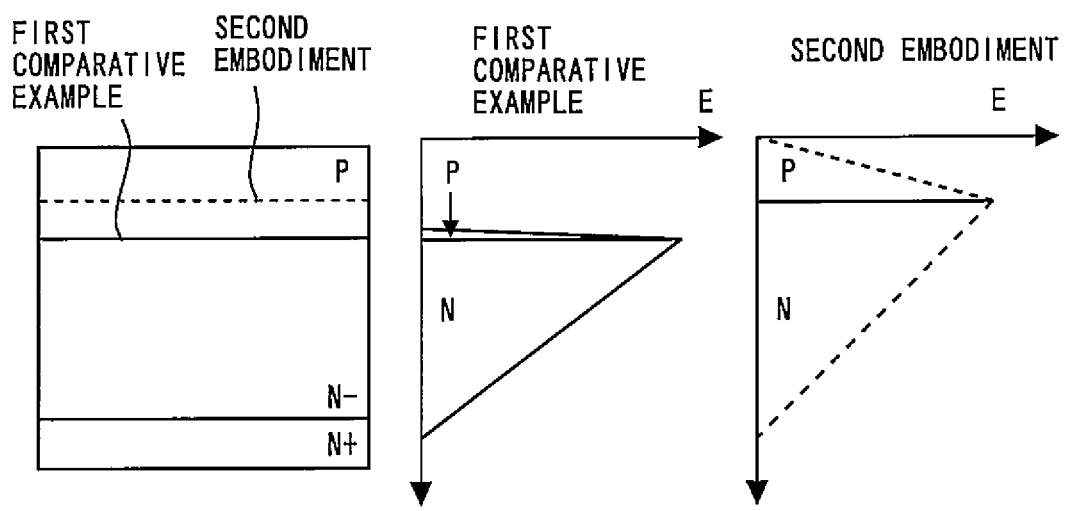
FIG. 17 is the graphs showing the field strength under the gate pad in the second embodiment and the first comparative example.

FIG. 17 is the graphs showing the field strength under the gate pad in the second embodiment and the first comparative example. The abscissas show the field strengths, and the ordinates show the depths from the surface of the silicon substrate 1. The areas of the triangles in the graphs correspond to the voltages maintained by the N$^-$-type drain layer 2 and the P-type base layer 23, respectively. In the first comparative example, almost all breakdown voltage is maintained by the depletion layer spreading in the N$^-$-type drain layer 2. In the second embodiment on the other hand, since the depletion layer also spreads into the P-type base layers 23, the voltage share of the P-type base layer 23 increases. Thereby, the field strength in the vicinity of the PN junction in the avalanche time is reduced, and the impact-ionized current can be lowered.

In addition, the impurity concentration in the P-type base layers 23 is preferably 1.0 to 2.0 E12 ions/cm$^2$. Thereby, when an opposite breakdown voltage is applied to the PN junction, a RESURF (Reduced Surface Field) condition, in which a depletion layer is spread in the entire diffusing layer of both P and N, is produced. Therefore, the depletion layer is spread in the entire P-type base layers 23. Thereby, the impact-ionized current can be further lowered.

Furthermore, it is preferable that the P-type base layers 5 in the cell region are simultaneously formed with the P-type base layers 23 in the pad region. Thereby, both structures can be formed without increasing the number of masks.

Figure 18:
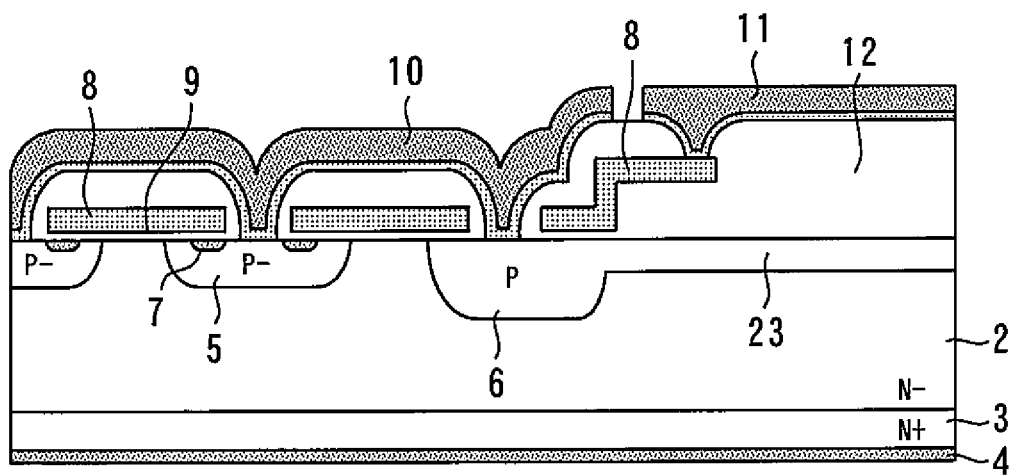
FIG. 18 is a sectional view showing a modified example of the semiconductor device according to the second embodiment of the present invention.

FIG. 18 is a sectional view showing a modified example of the semiconductor device according to the second embodiment of the present invention. Although the gate pad 11 side of the P-type base layers 6 was of the VLD structure in FIG. 16, the P-type base layers 6 in this modified example have no VLD structures. Also in this case, since the P-type base layers 23 are shallower than the deepest portion of the P-type base layers 6, the impact-ionized current can be lowered.

Also since the VLD structure produces the patterns by stripes and minute hole shapes, well size-controlled fine processing devices are required. In the modified example, such a well size-controlled fine processing devices are not required.

Third Embodiment

Figure 19:
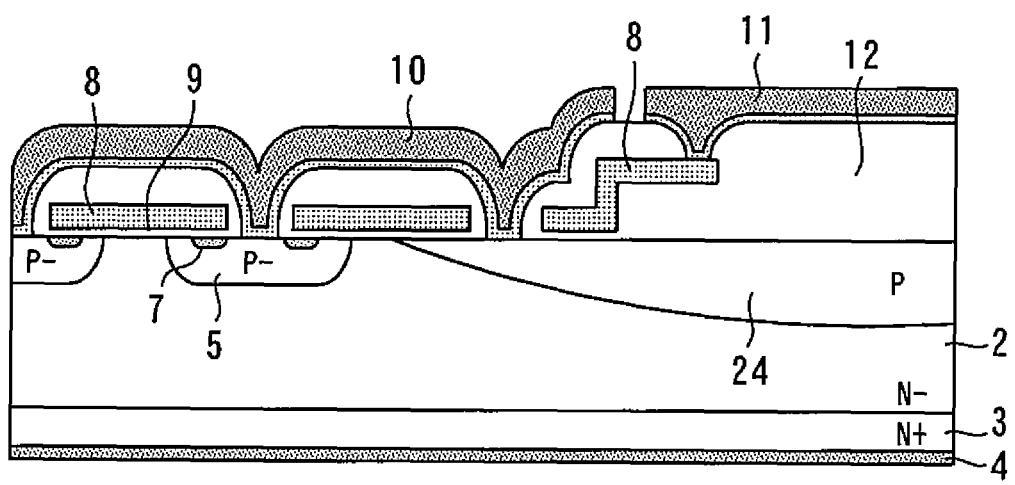
FIG. 19 is a sectional view showing a semiconductor device according to the third embodiment of the present invention.

FIG. 19 is a sectional view showing a semiconductor device according to the third embodiment of the present invention. In place of the P-type base layers 6 of the first embodiment, the P-type base layers 24 are provided on the N$^-$-type drain layer 2 in the intermediate region and the pad region. The impurity concentration in the P-type base layers 24 increases toward the center of the gate pad 11, and reaches the peak at the center portion of the gate pad 11. The impurity concentration gradation of the P-type base layers 24 has a more gentle VLD structure in comparison with the P-type base layers 5. Thereby, the impact-ionized current in the avalanche operation can be lowered.

In addition, in the first to third embodiments, the present invention is applied to the n-channel power MOSFET. However, the present invention is not limited to this application and can also be applied to p-channel power MOSFETs, IGBTs, or SiC devices.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-011869, filed on Jan. 24, 2012 including specification, claims, drawings and summary, on which the Convention priority of the present application is based, are incorporated herein by reference in its entirety.

What is claimed is:

1. A semiconductor device comprising:
    a semiconductor layer of a first conductivity type in a cell region, a pad region, and an intermediate region placed between the cell region and the pad region of a semiconductor substrate;
    wherein the cell region has first and second parts, the intermediate region has first and second parts, the first and second parts of the intermediate region are placed between the pad region and the first and second parts of the cell region respectively, and the pad region is placed between the first and second parts of the intermediate region;
    a first base layer of a second conductivity type on the semiconductor layer in the cell region;
    a second base layer of the second conductivity type on the semiconductor layer in the intermediate region;
    a conductive region of the first conductivity type in the first base layer;
    a gate electrode on a channel region placed between the conductive region and the semiconductor layer via a gate insulating film;
    a first electrode connected to the first and second base layers;
    a second electrode connected to a lower face of the semiconductor layer; and
    a gate pad on the semiconductor layer via an insulating film in the pad region and connected to the gate electrode,
    wherein an impurity concentration gradation in the gate pad side of the second base layer has a VLD (Variation Lateral Doping) structure which is gentler than an impurity concentration gradation in the first base layer.

2. The semiconductor device according to claim 1, further comprising a third base layer of the second conductivity type on the semiconductor layer in an edge termination region placed outside the cell region and the pad region of the semiconductor substrate,
    wherein an impurity concentration gradation in an outside of the third base layer has a VLD structure which is gentler than an impurity concentration gradation in the first base layer.

3. The semiconductor device according to claim 1, further comprising a gate finger on the semiconductor layer via the insulating film in the pad region and connecting the gate electrode to the gate pad,
    wherein an impurity concentration gradation in the gate finger side of the second base layer has a VLD structure which is gentler than an impurity concentration gradation in the first base layer.

4. The semiconductor device according to claim 1, wherein an impurity concentration gradation in a side opposite to the gate pad side of the second base layer has a VLD structure which is gentler than an impurity concentration gradation in the first base layer.

5. The semiconductor device according to claim 1, wherein a depth of the second base layer as measured perpendicularly from an upper surface of the semiconductor layer to an edge of the second base layer decreases in a first direction toward the pad region on the gate pad side having the VLD at a lower rate than in a second direction opposing the first direction region on a side of the second base layer not having the VLD structure.

* * * * *